US009544172B2

(12) United States Patent
Terada et al.

(10) Patent No.: US 9,544,172 B2
(45) Date of Patent: Jan. 10, 2017

(54) SIGNAL PROCESSING APPARATUS AND METHOD (71) Applicant: YAMAHA CORPORATION, Hamamatsu-shi (JP)

(72) Inventors: Kotaro Terada, Hamamatsu (JP); Shunichi Kamiya, Hamamatsu (JP)

(73) Assignee: YAMAHA CORPORATION, Hamamatsu-shi (JP)

(*) Notice: Subject to any disclaimer, the term of this patent is extended or adjusted under 35 U.S.C. 154(b) by 0 days.

(21) Appl. No.: 14/657,410

(22) Filed: Mar. 13, 2015

(65) Prior Publication Data
US 2015/0263871 A1 Sep. 17, 2015

(30) Foreign Application Priority Data

Mar. 17, 2014 (JP) .................. 2014-053083

(51) Int. Cl.
H03H 7/30 (2006.01)
H03H 7/40 (2006.01)
H03K 5/159 (2006.01)
H04L 27/01 (2006.01)
H04L 27/08 (2006.01)
H03G 5/00 (2006.01)
H03G 5/02 (2006.01)
H03G 5/16 (2006.01)

(52) U.S. Cl.
CPC ............ *H04L 27/01* (2013.01); *H03G 5/005* (2013.01); *H03G 5/025* (2013.01); *H03G 5/165* (2013.01); *H04L 27/08* (2013.01)

(58) Field of Classification Search
CPC ....... H04L 27/01; H04L 27/08; H03G 5/0055; H03G 5/025; H03G 5/165

USPC ................. 375/229, 232, 230, 345
See application file for complete search history.

(56) References Cited

U.S. PATENT DOCUMENTS

2012/0063614 A1  3/2012  Crockett et al.
2015/0169280 A1* 6/2015  Suzuki .................. H03G 5/025
                                                              715/716

FOREIGN PATENT DOCUMENTS

EP    1233509 A1   8/2002
EP    2618484 A2   7/2013
JP    07042219 U   7/1995

(Continued)

OTHER PUBLICATIONS

European Search Report issued in European counterpart application No. EP15159127.8, dated Jul. 23, 2015.

(Continued)

*Primary Examiner* — Phuong Phu
(74) *Attorney, Agent, or Firm* — Rossi, Kimms & McDowell LLP (57) ABSTRACT Reference gain values Ga1, Gb1 and Gc1 are set for respective EQ points A, B and C of a plurality of frequency bands in EQ CURVE 1 currently set in an EQ module. In response to an operation of an operator, an intensity parameter value, which is a multiplier for the reference gain values Ga1, Gb1 and Gc1, is changed, so that the reference gain values Ga1, Gb1 and Gc1 are changed in a collective fashion. In EQ CURVE 2 having been changed from EQ CURVE 1, the intensity parameter value exceeds "1 (100%)" and actual gain values of the EQ points A', B' and C' of the frequency bands are Ga2, Gb2 and Gc2, so that EQ CURVE 2 assumes emphasized frequency characteristics.

13 Claims, 5 Drawing Sheets (56) References Cited

FOREIGN PATENT DOCUMENTS

| JP | 2003348683 A | 12/2003 |
|----|--------------|---------|
| WO | 2012160415 A1 | 11/2012 |
| WO | 2014038154 A1 | 3/2014 |

OTHER PUBLICATIONS

Office Action issued in European Patent Application No. EP15159127.8, mailed Sep. 5, 2016.

* cited by examiner

FIG. 1

Gx2 = Gx1( REFERENCE GAIN VALUE ) × INTENSITY VALUE

Gx2' = Gx1( REFERENCE GAIN VALUE ) × INTENSITY VALUE × WEIGHT VALUE "Wx"

SIGNAL PROCESSING APPARATUS AND METHOD

BACKGROUND

The present invention relates generally to a signal processing apparatus and a method which allow equalizer setting operations to be performed with ease.

In the conventionally-known signal processing apparatus that handle audio signals, an equalizer (hereinafter sometimes abbreviated as "EQ") is often used for adjusting gain (amplitude) characteristics, on a frequency axis, of an audio signal as desired by a user. Among the various conventionally-known EQs for audio signals are a graphic equalizer (hereinafter sometimes abbreviated as "GEQ") which adjusts gain (amplitude) characteristics by dividing in advance an audible frequency range of an audio signal into a plurality of divided frequency bands and adjusting a gain for each of the divided frequency bands, and a parametric equalizer (hereinafter sometimes abbreviated as "PEQ") in which a user designates a frequency value, a gain value and a quality factor ("Q"). For adjustment of a gain for each of the divided frequency bands, a plurality of knobs slidable, for example, in a vertical (up-down) direction are provided in the GEQ, and a user can know individual gains and approximate frequency characteristics of the gains from positions of the knobs. The PEQ has been used more and more widely nowadays by virtue of the recent popularization of DSPs (Digital Signal Processors) for audio signals. In the PEQ, the DSP performs adjusting operation for achieving a frequency characteristic corresponding to a gain value and a Q value designated as characteristic setting factors by a user, unlike in the GEQ where frequency bands are determined in advance and gain adjustment is performed for each of the frequency bands.

Generally, fundamental parameters in the EQs are three parameters: a frequency F selected for each of a plurality of frequency bands; a gain G in each of the selected frequencies F; and a Q value that is indicative of a rise variation characteristic until the gain G set in the selected frequency F is reached and a fall variation characteristic. An equalizer point (hereinafter sometimes abbreviated as "EQ point") for each of the frequency bands is designated by such three parameters. When an equalizer curve (hereinafter sometimes abbreviated as "EQ curve") indicative of frequency characteristics of gains is to be emphasized or de-emphasized in an equalizer point (hereinafter sometimes abbreviated as "EQ module") having a plurality of EQ points, gain values of the EQ points are changed relatively. For such a purpose, user's operations for selecting any one of the EQ points and changing the gain value of the selected EQ point have to be performed for each of the EQ points.

Further, in the conventionally-known mixers which mix sounds etc. picked up by a plurality of microphones and send a mixed result to various recording devices (as disclosed, for example, in Japanese Utility Model Laid-open Publication No. HEI-7-42219 and Japanese Patent Application Laid-open Publication No. 2003-348683), there is employed a DCA (Digital Controlled Amplifier) technique that has a parameter common to a plurality of parameters (channel-specific fader values) and relatively changes executed values of the plurality of parameters. However, such a DCA technique has no direct relation to the EQ module.

In a case where operations for relatively changing gain values of EQ points are performed and where operators corresponding to all parameters are provided on a panel as in the conventionally-known large-size analog mixer, at least an operation for selecting an EQ point can be significantly simplified. However, with recent digital mixers where the number of operators provided on the panel is small, the operations for relatively changing the gain values of the EQ points would become more complicated. Further, although digital mixers equipped with a touch panel are also known today, such digital mixers too require the operations for selecting EQ points, and thus, the necessary operations are still complicated. Namely, in the conventionally-known signal processing apparatus, the user's operations for selecting an EQ point and changing a gain value of the EQ point have to be performed for each of the EQ points, and thus, the necessary operations cannot be performed in a simplified manner.

SUMMARY OF THE INVENTION

In view of the foregoing prior art problems, it is an object of the present invention to provide an improved signal processing apparatus and method which, when respective values of a plurality of control points in an equalizer curve are to be changed in an equalizer module, can collectively change the values of the control points.

In order to accomplish the above-mentioned object, the present invention provides an improved signal processing apparatus, which comprises: a processing unit configured to execute an equalizer module for processing a signal, the equalizer module performing signal processing according to a frequency characteristic indicated by a given equalizer curve, the given equalizer curve being determined based on a reference equalizer curve prepared in advance; and a processor configured to: receive a magnification parameter for adjusting an intensity of the reference equalizer curve; and determine the given equalizer curve by adjusting the intensity of the reference equalizer curve in accordance with the received magnification parameter.

With the signal processing apparatus of the present invention, where an equalizer curve to be used by the equalizer module in the signal processing is determined based on the basis of the reference equalizer curve and the magnification parameter, it is possible to obtain the given equalizer curve by merely adjusting the one magnification parameter to thereby adjust the overall intensity of the reference equalizer curve. In this way, it is possible to manipulate the equalizer curve with ease. As an example, the processor is configured to multiply each of gain values of a plurality of frequencies, corresponding to a plurality of control points in the reference equalizer curve, by the magnification parameter, and the reference equalizer curve is determined based on changing of the gain values at the control points. In this case, the gain values at the control points can be changed collectively, and gain characteristics in other frequency regions are changed in accordance with changes of the gain values made at the control points.

It should be appreciated that the present invention may be constructed and implemented not only as the apparatus invention discussed above but also as a method invention. Also, the present invention may be arranged and implemented as a software program for execution by a processor, such as a computer or DSP, as well as a non-transitory computer-readable storage medium storing such a software program.

The following will describe embodiments of the present invention, but it should be appreciated that the present invention is not limited to the described embodiments and various modifications of the invention are possible without departing from the basic principles. The scope of the present invention is therefore to be determined solely by the appended claims.

BRIEF DESCRIPTION OF THE DRAWINGS

Certain preferred embodiments of the present invention will hereinafter be described in detail, by way of example only, with reference to the accompanying drawings, in which.

DETAILED DESCRIPTION

Figure 1:
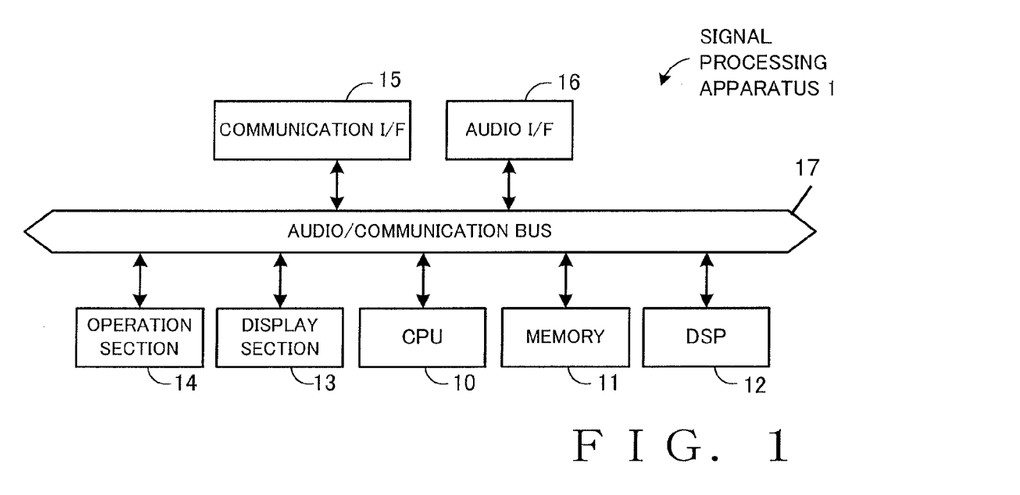
FIG. 1 is a block diagram showing an overall construction of a signal processing apparatus according to an embodiment of the present invention.

FIG. 1 is a block diagram showing an overall construction of an embodiment of a signal processing apparatus of the present invention. The embodiment of the signal processing apparatus includes an EQ (equalizer) module of the present invention.

In the signal processing apparatus 1 shown in FIG. 1, signal processing is performed using a DSP (Digital Signal Processor) 12. More specifically, signal processing, such as audio signal volume control, panning, delay adjustment and effect impartment and gain (amplitude) characteristics processing, on the frequency axis, of an audio signal, is performed under control of a CPU (Central Processing Unit) 10. Overall control on the signal processing apparatus 1 is performed by the CPU 10. Operational software to be executed by the CPU 10 is prestored, for example, in a rewritable non-volatile flash memory of a memory 11, and the memory 11 includes a RAM (Random Access Memory) where are stored a working area for use by the CPU 10 and various data. A display section 13 is, for example, in the form of a liquid crystal display, and displays various operation screens related to signal processing. An operation section 14 includes operators, such as knobs and switches, and detects operations, by a user, of the operators. Parameters to be used in signal processing can be edited or manipulated on the basis of detected operation signals. A communication I/F 15 is an interface for performing communication between the signal processing apparatus 1 and external equipment, which is, for example, a networking interface, such as Ethernet (registered trademark).

An audio interface or I/F 16 includes an analog input port for inputting an audio signal to the signal processing apparatus 1, an analog output port for outputting an audio signal having been subjected to signal processing, and a digital input/output port for inputting a digital signal and outputting a digital signal having been subjected to signal processing. An audio signal input via the analog input port is converted into a digital signal and sent to an audio/communication bus 17, and an input digital signal too is sent to the audio/communication bus 17. The digital signal sent to the audio/communication bus 17 is received by the DSP 12 where predetermined signal processing is performed on the digital signal. Note that the DSP 12 has microprograms of one EQ module incorporated therein and executes the EQ module. In this way, an audio signal sent from the EQ module, executed by the DSP 12, to the audio/communication bus 17 can be supplied via the audio I/F 16 to a speaker and the like.

Further, a desired EQ curve is settable in the EQ module under control of the CPU 10, and by the DSP 12 executing the EQ module, signal processing is performed on an audio signal in accordance with frequency characteristics indicated by the EQ curve set in the EQ module. As an example, with the signal processing apparatus 1 of the present invention, operations for relatively changing gain values of a plurality of EQ points in a three-band EQ curve set in the EQ module as shown in FIG. 2 can be performed in a simplified manner.

Figure 2:
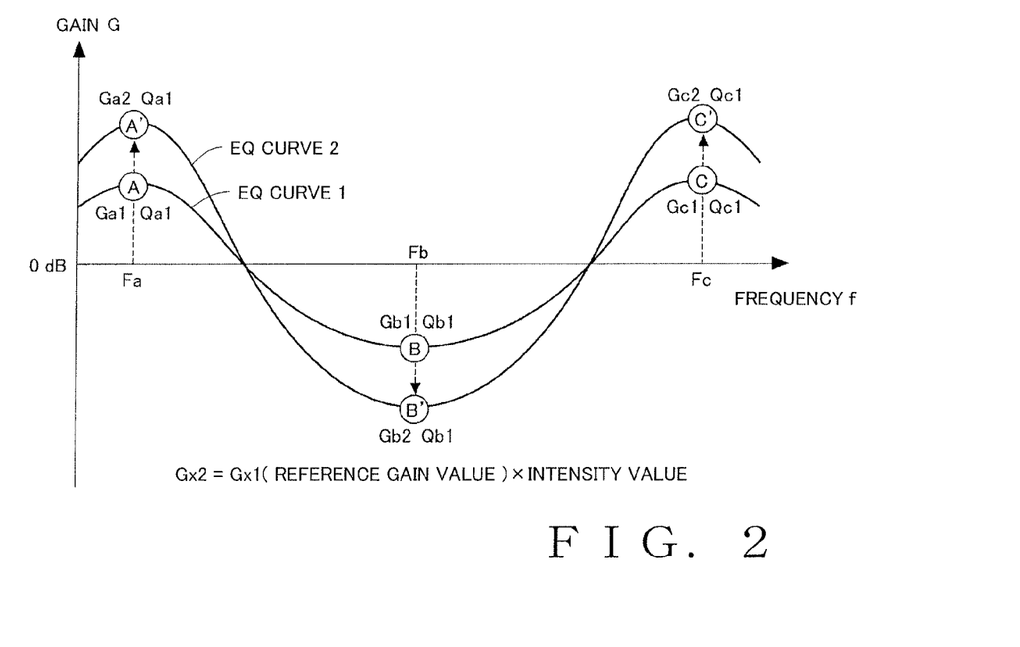
FIG. 2 is a diagram showing an example manner in which an EQ curve set in an EQ module is adjusted in a first embodiment of the signal processing apparatus of the present invention.

FIG. 2 is a diagram showing an example manner in which the EQ curve set in the EQ module is adjusted in a first embodiment of the signal processing apparatus 1 of the present invention. In FIG. 2 is shown the manner in which EQ CURVE 1 having three frequency bands (hereinafter also referred to simply as "bands") set in the EQ module is changed into EQ CURVE 2. In EQ CURVE 1, EQ point (EQ frequency point) A is set in the lowest band, EQ point (EQ frequency point) B is set in the middle band, and EQ point (EQ frequency point) C is set in the highest band. For each of the EQ points are preset three parameters: a selected frequency F; a gain G of the selected frequency; and a Q value indicative of a rise variation characteristic until the gain G set in the selected frequency F is reached and a fall variation characteristic. In this case, EQ CURVE 1 prepared in advance (i.e., EQ curve not yet adjusted by a user) will hereinafter be referred to as "reference equalizer curve" or "reference EQ curve", and the gain value set in the reference EQ curve will hereinafter be referred to as "reference gain value". Namely, at EQ point A in EQ CURVE 1 that is the reference EQ curve, the frequency is set at Fa, the reference gain value is set at Ga1, and the Q value is set at Qa1. At EQ point B, the frequency is set at Fb, the reference gain value is set at Gb1, and the Q value is set at Qb1. Further, at EQ point C, the frequency is set at Fc, the reference gain value is set at Gc1, and the Q value is set at Qc1. Note that the reference gain values Ga1 and Gc1 in EQ CURVE 1 or the reference EQ curve shown in FIG. 2 are positive gain values exceeding or greater than 0 dB while the reference gain value Gb1 is a negative gain value smaller than 0 dB. As an example, a set of coefficients constituting the reference EQ curve is stored in a non-volatile fashion in the memory 11, so that the set of coefficients is read out to the working area within the memory 11 in response to a selection operation by the user and then sent from the working area to the DSP 12 and is set as EQ coefficients for use in the EQ module. Later-described modification operations on the reference EQ curve are performed on the EQ curve stored in the working area within the memory 11, and each time the EQ curve stored in the working area is changed, settings (EQ coefficients) of the EQ curve in the EQ module within the DSP 12 are changed.

In the first embodiment of the signal processing apparatus 1 of the present invention, a later-described operator is provided which is operable to perform operations for relatively changing the gain values of the plurality of EQ points in a collective fashion in the EQ module, and a value of an intensity parameter (hereinafter sometimes referred to as "intensity parameter value") can be adjusted by a user or human operator operating the operator. The "intensity parameter" is a magnification parameter that is a multiplier indicative of an application intensity of the reference EQ curve, and a gain value calculated by multiplying the reference gain value, set for each of the EQ points (i.e., control points), by the intensity parameter value becomes an actual gain value of that EQ point (control point). In EQ CURVE 1 shown in FIG. 2, the value of the intensity parameter is "1 (100%)", so that the actual gain value and the reference gain value match each other. Then, once the operator is operated so as to cause the intensity parameter value to exceed "1", EQ CURVE 1 is changed to EQ CURVE 2 emphasized as compared to EQ CURVE 1 as shown in FIG. 2. In EQ CURVE 2, EQ points of frequencies Fa, Fb and Fc are indicated as A', B' and C', respectively, and an actual gain value Ga2 of the EQ point A' in EQ CURVE 2 is a positive gain value having an increased absolute value calculated by multiplying the reference gain value Ga1 by a value of the intensity parameter (intensity parameter value) greater than, i.e. exceeding, "1", an actual gain value Gb2 of the EQ point B' in EQ CURVE 2 is a negative gain value having an increased absolute value calculated by multiplying the reference gain value Gb1 by the intensity parameter value greater than "1", and an actual gain value Gc2 of the EQ point C' in EQ CURVE 2 is a positive gain value having an increased absolute value calculated by multiplying the reference gain value Gc1 by an intensity parameter value greater than "1". Namely, the gain values of the EQ points A, B and C are relatively changed in a collective fashion in response to a user's manipulation of the intensity parameter value. In this case, if the intensity parameter value is greater than, i.e. exceeds, "1", EQ CURVE 2 assumes frequency characteristics where the gain values of the plurality of EQ points in EQ CURVE 2 have been emphasized relative to the gain values of the plurality of EQ points in EQ CURVE 1. If the intensity parameter value is smaller than "1", on the other hand, EQ CURVE 2 assumes flat frequency characteristics where the gain values of the plurality of EQ points in EQ CURVE 2 have been de-emphasized relative to the gain values of the plurality of EQ points in EQ CURVE 1. Namely, EQ CURVE 2 is determined on the basis of EQ CURVE 1, i.e. the reference Q curve, and the intensity parameter value that is a magnification parameter. More specifically, EQ CURVE 2 is determined by the intensity parameter value being multiplied to each of the gain values of the plurality of EQ points, i.e. the control points, in EQ CURVE 1. EQ CURVE 2 thus determined is used in the signal processing by the EQ module.

In the first embodiment of the signal processing apparatus 1 of the present invention, as noted above, an actual gain value Gx2 of an EQ point X' when the intensity parameter value has been changed is expressed by the following mathematical expression (1):

$$Gx2 = Gx1 * \text{intensity parameter value} \quad (1)$$

In Mathematical Expression (1) above, Gx1 represents a reference gain value of an EQ point X, and the asterisk "*" denotes multiplication. Note that the Q value is not changed in response to a change of the intensity parameter value.

The EQ curve representative of frequency characteristics the EQ module is determined in accordance with three parameters: a frequency F selected for each of the plurality of EQ points; a gain G of the selected frequency F; and a Q value. Then, the gain values of the plurality of EQ points can be relatively changed in a collective fashion in response to the user operating the one operator to change the intensity parameter value. Namely, by merely operating the one operator, the user can perform, with an increased ease, the operations for relatively changing the gain values of the EQ points (i.e., EQ curve).

Figure 3:
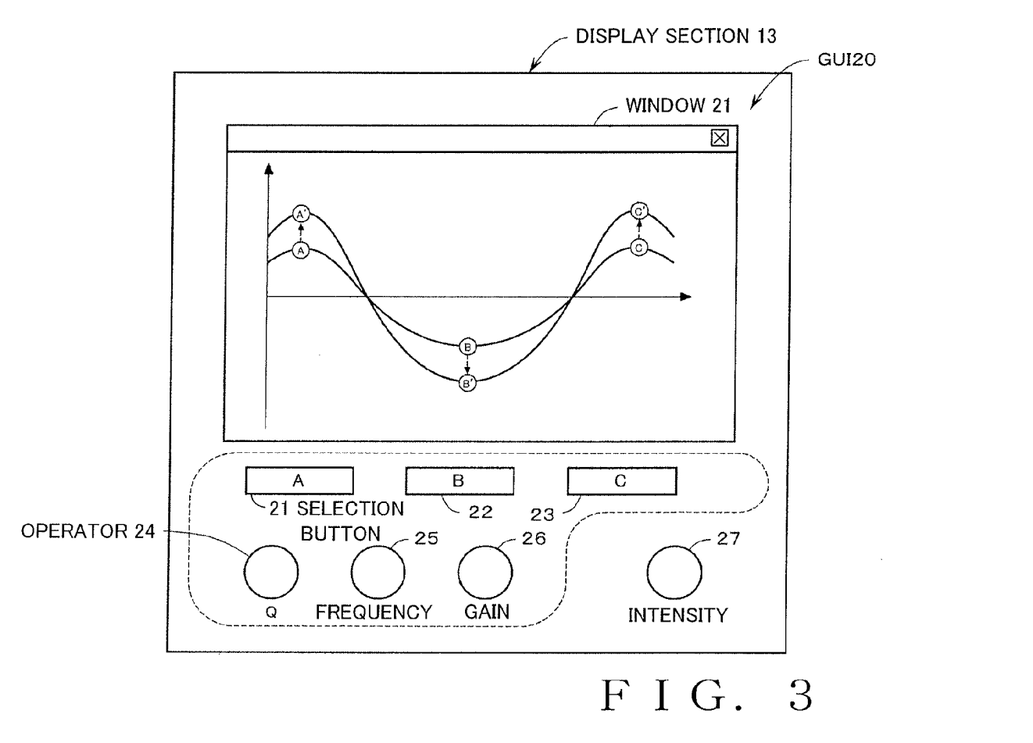
FIG. 3 is a diagram showing an image of a GUI for adjusting the EQ curve set in the EQ module in the signal processing apparatus of the present invention.

FIG. 3 shows an image of a GUI (Graphical User Interface) 20 displayed on the display section 13 when setting and editing of the EQ module is to be performed in the signal processing apparatus 1 of the present invention.

In the GUI 20 shown in FIG. 3, an EQ curve is displayed on a window 21 when setting and editing of the EQ module is being performed. Selection buttons 21, 22 and 23 (labeled "A", "B" and "C") for selecting a desired band of the EQ module are provided in a horizontal row below the window 21. Further, an operator 24 for setting a Q value, an operator 25 for selecting a frequency and an operator 26 for setting a gain are provided in a horizontal row below the selection buttons 21, 22 and 23. Further, an operator 27 for adjusting the intensity parameter value is provided laterally of the gain-setting operator 26 with a slight distance from the latter. For example, these operators 24 to 27 may be in the form of endless rotary operators, such as rotary encoders. More specifically, each of such rotary operators may be a relative-value type operator of which a relative value (variation amount) of an operating position is detected, which can be rotated any desired number of times, and which can increase the current value of the parameter assigned thereto when it is rotated in a clockwise direction and decrease the current value of the parameter assigned thereto when it is rotated in a counterclockwise direction. An EQ curve having been set through operations of the operators 24 to 27 becomes an EQ curve to be used by the EQ module in the signal processing.

By the user clicking a cursor on the selection button 21 (i.e., operating the selection button 21) by use of a not-shown pointing device, the band corresponding to the EQ point A is selected, so that a Q value, frequency and gain value of the EQ point A can be set via the operators 24, 25 and 26, respectively. Similarly, by the user clicking the cursor on the selection button 22 or 23 (i.e., operating the selection button 22 or 23) by use of the not-shown pointing device, a Q value, frequency and gain value of the EQ point of the selected band can be set via the operators 24, 25 and 26, respectively. Further, if the user operates the operator 27, the intensity parameter value is changed in accordance with an operated amount of the operator 27, so that the gain values of the individual EQ points A, B and C are relatively changed in a collective fashion as set forth above. A manner in which the gain values of the individual EQ points A, B and C are relatively changed in a collective fashion is displayed on the window 21, so that, by operating the operator 27 while viewing the display on the window 21, the user can make adjustments such that the EQ curve assumes desired frequency characteristics.

Note that, depending on a current display mode of the GUI 20, the selection buttons 21 to 23 within a range surrounded by broken line in FIG. 3 may be placed in a non-displayed state so that the GUI 20 comprises only the window 21 and the intensity-parameter-value manipulating operator 27. Further, in the case where the display section 13 is in the form of a touch panel 13, the user can select desired buttons and operate desired operators by touching the screen of the display section 13 without using the pointing device.

According to a second embodiment of the signal processing apparatus 1 of the present invention, a weight indicative of a degree of effectiveness of the intensity parameter value on the reference gain is defined per frequency. The other structural elements in the second embodiment are similar to those in the above-described first embodiment.

Figure 4:
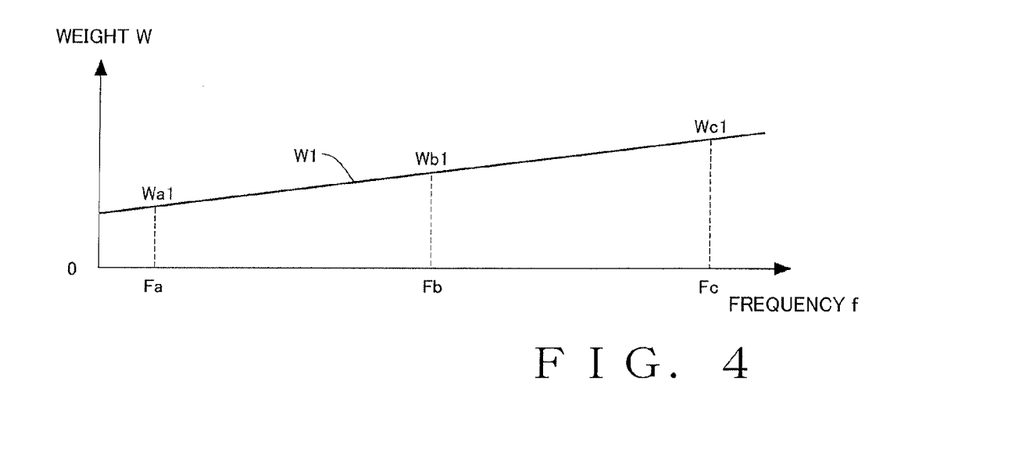
FIG. 4 is a diagram showing an example of a weight curve in the EQ module of a second embodiment of the signal processing apparatus of the present invention.
Figure 5:
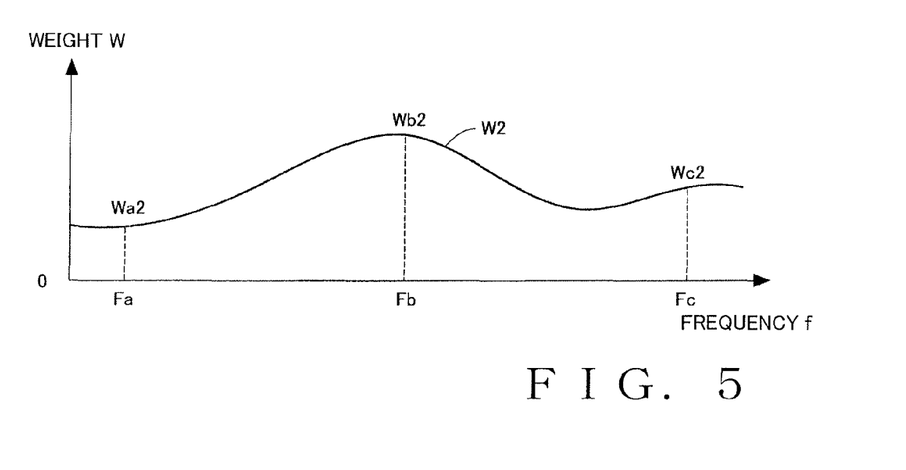
FIG. 5 is a diagram showing another example of the weight curve in the EQ module of the second embodiment of the signal processing apparatus of the present invention.

Namely, in the second embodiment of the signal processing apparatus 1, a gain value calculated, for each of the EQ points, by multiplying the reference gain value of the EQ point by the intensity parameter value and the weight value becomes an actual gain value of the EQ point. In this case, the weight is defined by a weight curve where the weight varies in accordance with the frequency. One example of such a weight curve is shown in FIG. 4, where the horizontal axis represents the frequency while the vertical axis represents the weight W, and where the weight curve W1 has such linear frequency characteristics that the weight value W increases uniformly or at a uniform rate as the frequency rises. Further, the weight values of the frequencies Fa, Fb and Fc in the weight curve W1 of FIG. 4 are Wa1, Wb1 and Wc1 which are in a relationship of Wa1<Wb1<Wc1. Another example of such a weight curve is shown in FIG. 5, where the horizontal axis represents the frequency while the vertical axis represents the weight W as in FIG. 4. In FIG. 5, the weight curve W2 has such curved frequency characteristics that the weight value W increases to a middle frequency so as to have a peak at the middle frequency, and that, after passage through the middle frequency, the weight value W decreases and then gradually increases as the frequency rises so as to have a second peak. Further, the weight values of the frequencies Fa, Fb and Fc in the weight curve W2 of FIG. 5 are Wa2, Wb2 and Wc2 which are in a relationship of Wa2<Wb2<Wc2.

Figure 6:
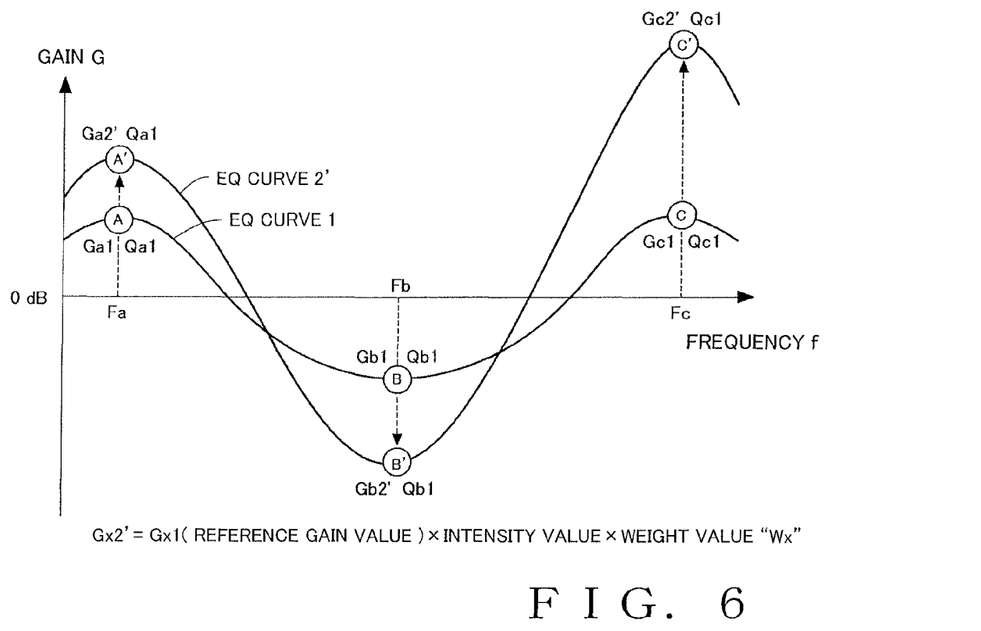
FIG. 6 is a diagram showing an example manner in which the EQ curve in the EQ module is adjusted in the second embodiment of the signal processing apparatus of the present invention.

FIG. 6 is a diagram showing an example manner in which the EQ curve in the EQ module is adjusted in the second embodiment of the signal processing apparatus 1 of the present invention. More specifically, in FIG. 6 is shown the manner in which EQ CURVE 1 of three bands set in the EQ module is changed into EQ CURVE 2'. EQ CURVE 1 in the second embodiment is similar in construction to EQ CURVE 1 in the first embodiment and thus will not be described here to avoid unnecessary duplication. In the second embodiment, there are prepared in advance a plurality of weight curves including the weight curves W1 and W2 shown in FIGS. 4 and 5, and any one of the weight curves can be selected in the illustrated example of FIG. 6. Let it be assumed here that the weight curve W1 of the characteristics shown in FIG. 4 has been selected. If the intensity-parameter-value manipulating operator 27 is operated to cause the intensity parameter value to exceed "1" so that EQ CURVE 1 is emphasized, EQ CURVE 1 is changed to EQ CURVE 2' emphasized with respect to EQ CURVE 1. In this EQ CURVE 2', EQ points of frequencies Fa, Fb and Fc are depicted as A', B' and C', respectively. An actual gain value Ga2' of the EQ point A' in EQ CURVE 2' is a positive gain value whose absolute value has increased by being calculated by multiplying the reference gain value Ga1 by an intensity parameter value greater than "1" and the weight value Wa1 of the frequency Fa in the weight curve W1, an actual gain value Gb2' of the EQ point B' in EQ CURVE 2' is a negative gain value whose absolute value has increased by being calculated by multiplying the reference gain value Gb1 by an intensity parameter value greater than "1" and the weight value Wb1 of the frequency Fb in the weight curve W1, and an actual gain value Gc2' of the EQ point C' in EQ CURVE 2' is a positive gain value whose absolute value has increased by being calculated by multiplying the reference gain value Gc1 by an intensity parameter value greater than "1" and the weight value Wc1 of the frequency Fc in the weight curve W1. Further, in the second embodiment, the gain values of the individual EQ points A, B and C are relatively changed collectively, but, if the intensity parameter value exceeds "1", the weight value increases (Wa1<Wb1<Wc1) as the frequency rises, as set forth above in relation to FIG. 4; thus, EQ CURVE 2' assumes such frequency characteristics that the gain values of the plurality of EQ points in EQ CURVE 1 have been emphasized as the frequency rises. If the intensity parameter value is smaller than "1", on the other hand, the gain values of the individual EQ points in EQ CURVE 1 are lowered or deemphasized, but EQ CURVE 2' assumes such frequency characteristics that the gain values are deemphasized less as the frequency rises.

In the second embodiment of the signal processing apparatus 1 of the present invention, as set forth above, the actual gain value Gx2' of the EQ point X' when the intensity parameter value has been changed can be expressed by the following mathematical expression (2):

$$Gx2'=Gx1 * \text{intensity parameter value} * \text{weight value } x \quad (2)$$

In Mathematical Expression (2) above, Gx1 represents the reference gain value of the EQ point, Wx represents a weight value for the frequency of the EQ point X in a weight curve selected from among a plurality of weight curves, and the asterisk "*" denotes multiplication. Note that the Q value is not changed even when the intensity parameter value is changed.

In the above-described second embodiment of the invention, where a weight indicative of a degree of effectiveness of the intensity parameter value on the reference gain is defined per frequency, the EQ module can change the degree of effectiveness of the intensity parameter value in accordance with a frequency band per tone generator type, such as a musical instrument type or music type. In this case, it suffices that a weight curve that is a multiplier curve mapped in a frequency direction be prepared per tone generator type and that any one of the multiplier curves thus prepared be selected in accordance with an assigned tone generator type. For example, when a weight curve for a snare drum has been selected, the degree of effectiveness of the intensity parameter value only for frequency bands of snares can be made different from that for the other frequency bands. Further, when a weight curve for a female or male has been selected, the degree of effectiveness of the intensity parameter value only for frequency bands of the female vocal or male vocal can be made different from that for the other frequency bands. Namely, in the second embodiment which is characterized by the weight curve definition in addition to a simple ratio change, by the intensity parameter, of the gain values of the EQ points (EQ curve), it is possible to relatively change the gain values in a collective fashion in such a manner that the gain value changes can become more effective, by the user only operating the one operator.

Referring to FIG. 6, as the gain values of the EQ points A, B and C are increased to Ga2', Gb2' and Gc2', frequencies traversing the "0 dB" line deviate as shown in EQ CURVE 2', so that mountains of the peaks of the EQ points A' and C' become thicker. Such a phenomenon occurs when the reference gain is multiplied by the intensity parameter value and the weight value in a case where the weight value in the weight curve is not uniform for all of the frequencies. However, where the user changes the intensity parameter value by operating the operator 27, there may arise a demand that only the gain values of the EQ points be increased without deviation of the frequencies traversing the "0 dB" line. Thus, a third embodiment of the signal processing apparatus 1 of the present invention is constructed to change the Q values in accordance with changes of the actual gain values of the EQ point. More specifically, in the third embodiment, the Q values are increased in accordance with increase of the actual gain values. Namely, the Q values are modified in such a manner that mountains of the peaks become thinner as the actual gain values increase. In this way, the third embodiment of the signal processing apparatus 1 can change the gain values of the EQ points without substantially changing the frequencies traversing the "0 dB" of the EQ curve.

Figure 7:
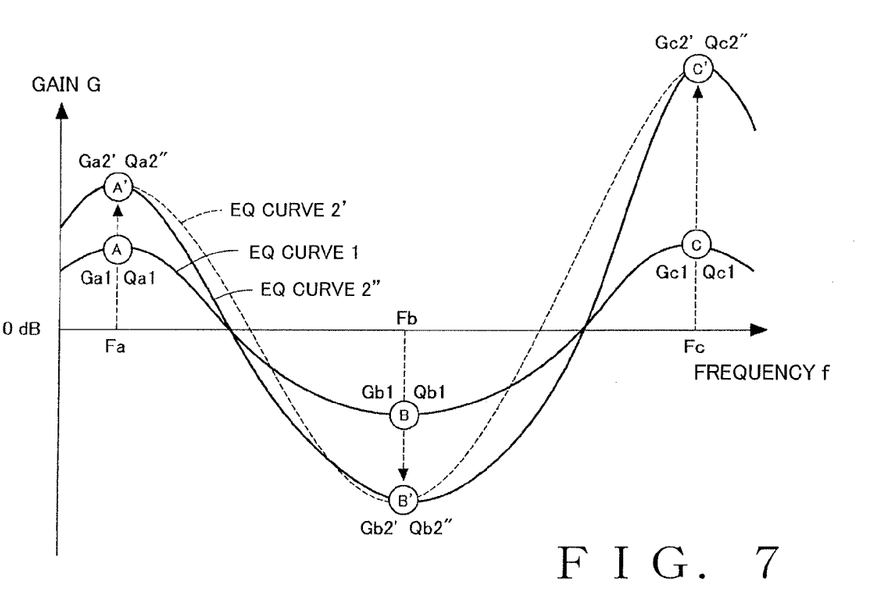
FIG. 7 is a diagram showing an example manner in which an EQ curve in the EQ module is adjusted in a third embodiment of the signal processing apparatus of the present invention.

FIG. 7 is a diagram showing an example manner in which the EQ curve in the EQ module is adjusted in the third embodiment of the signal processing apparatus 1 of the present invention. More specifically, in FIG. 7 is shown the example manner in which EQ CURVE 1 of three bands set in the EQ module is changed into EQ CURVE 2". EQ CURVE 1 in the third embodiment is similar in construction to EQ CURVE 1 in the first embodiment and thus will not be described here to avoid unnecessary duplication. Let it be assumed here that the weight curve W1 of FIG. 4 having such frequency characteristics that the weight value increases at a uniform rate has been selected from among a plurality of weight curves. If the intensity-parameter-value manipulating operator 27 is operated to cause the intensity parameter value to exceed "1" so that EQ CURVE 1 is emphasized, EQ CURVE 1 is changed to EQ CURVE 2" emphasized with respect to EQ CURVE 1 as shown in FIG. 7. In this EQ CURVE 2", EQ points of frequencies Fa, Fb and Fc are depicted as A', B' and C', respectively. The actual gain value Ga2' of the EQ point A' in EQ CURVE 2" is a positive gain value whose absolute value has increased by being calculated by multiplying the reference gain value Ga1 by an intensity parameter value greater than "1" and the weight value Wa1 of the frequency Fa, but also the Q value of the EQ point A' is increased, in accordance with the thus-calculated actual gain value Ga2', to Qa2". Further, the actual gain value Gb2' of the EQ point B' in EQ CURVE 2" is a negative gain value whose absolute value has increased by being calculated by multiplying the reference gain value Gb1 by an intensity parameter value greater than "1" and the weight value Wb1 of the frequency Fb, but the Q value of the EQ point B' is decreased to Qb2" because the thus-calculated actual gain value Gb2' is a small negative value. Further, the actual gain value Gc2' of the EQ point C' in EQ CURVE 2" is a positive gain value whose absolute value has increased by being calculated by multiplying the reference gain value Gc1 by an intensity parameter value greater than "1" and the weight value Wc1 of the frequency Fc, but also the Q value of the EQ point C' is increased, in accordance with the thus-calculated actual gain value Gc2', to Qc2". Namely, in response to the intensity parameter value being manipulated to exceed "1", the gain values of the EQ points A, B and C are relatively changed in a collective fashion, but also the Q values too are changed.

In the illustrated example of FIG. 7, the weight value increases (Wa1<Wb1<Wc1) as the frequency rises, but also the Q values are modified to increase as the calculated actual gains increase, as set forth above. Thus, EQ CURVE 2" has such frequency characteristics indicating that the gain values of the plurality of EQ points are emphasized with respect to EQ CURVE 1 as the frequency rises. Further, in EQ CURVE 2", the mountains of the positive peaks of the EQ points A' and C', where the actual gain values increase, become thinner, while the trough (negative peak) of the EQ point B', where the actual gain values decrease, becomes thicker. By depicting EQ CURVE 2" in broken line, FIG. 7 contrastively shows that the mountains of the positive peaks of the EQ points A' and C' become thinner while the trough (negative peak) of the EQ point B' becomes thicker. Whereas the Q value modification is performed to modify the Q values Qa", Qb" and Qc" in such a manner that frequencies of zerocross points, on the "0 dB" line, of EQ CURVE 2" are left unchanged from frequencies of zerocross points, on the "0 dB" line, of EQ CURVE 1, the present invention is not so limited, and the Q values Qa", Qb" and Qc" may be modified in such a manner that the mountains of the peaks of the EQ points A' and C' have user-desired thinness. Note that such a Q value change per frequency responsive to the intensity parameter value may be performed automatically through program processing by the CPU 10 rather than manually in response to a user's operation of the operator 24 of the CUI 120.

Conversely to the aforementioned, if the intensity parameter value is manipulated to be smaller than "1", the gain values of the individual EQ points A, B and C are relatively changed in a collective fashion in such a manner that EQ CURVE 2" assumes such frequency characteristics that the gain values are deemphasized less as the frequency rises while the gain values of the plurality of EQ points in EQ CURVE 1 are deemphasized. In this case, because the calculated actual gain values of the EQ points A' and C' are values having relatively decreased while the calculated actual gain value of the EQ point B' is a value having relatively increased as compared to the case where the intensity parameter value is greater than "1". Thus, the Q values of the EQ points A' and C' are modified to become smaller in accordance with the decreased actual gain values, while the Q value of the EQ point B' is modified to become greater in accordance with the increased actual gain value. In this manner, the mountains of the positive peaks of the EQ points A' and C' become relatively thicker, while the trough (negative peak) of the EQ point B' becomes relatively thinner. Thus, in the case where the weight value is not uniform for all of the frequencies, it is possible to change the gain values of the EQ points without substantially changing the frequencies traversing the "0 dB" line of the EQ even when the intensity parameter value has been changed.

The user may sometimes want to change any of the gain values of the EQ points after having changed the EQ curve by operating the operator 27 to adjust the intensity parameter. In this case, the user causes the GUI 120 shown in FIG. 3 to be displayed on the display section 13 and selectively operates any one of the selection buttons 21 to 23 to select a band to be edited. Then, by operating the gain setting operator 26, the user can change the gain value of the EQ point in the selected band. At that time, the user edits the gain value of the EQ point so that the reference gain value is replaced (updated) with a changed actual gain value, resets the intensity parameter value at "1 (100%)", edits the gain values of the individual EQ points so that the gain values are replaced (updated) with actual gain values even at the unchanged EQ points, and resets the intensity parameter value at "1 (100%)". This is because it is likely or predictable that, after the user's resetting of the gain value, the user will further adjust, i.e. increase or decrease, the degree of the effectiveness of the EQ on the basis of the reset gain value. Thus, although it was not possible to further increase the gain value for an EQ point where the intensity parameter value has reached the neighborhood of an upper limit, the aforementioned arrangements allow the actual gain value to be further increased through adjustment of the intensity parameter value because the intensity parameter value is returned to the initial value of "1 (100%)" by the aforementioned gain value resetting.

Further, because a value calculated by multiplying the reference gain value by a multiplier indicative of an application intensity of the reference RE curve, which is called the intensity parameter, becomes an actual gain value, alternative arrangements may be made such that the reference gain value is be calculated by dividing the changed actual gain value by the intensity parameter value set at that time (or by dividing the changed actual gain value by the intensity parameter value and weight value set at that time in the case of the above-described second and third embodiments), after which data of the EQ point in question may be edited so that the reference gain value is updated so that the calculated reference gain value becomes a new reference gain value. In this case, the intensity parameter value is maintained at a value having been adjusted immediately before the change. Also note that, in this case, the reference gain value of each of the unchanged EQ points is left practically unchanged.

Further, in the case of the above-described second and third embodiments, when the user has changed the gain value of any one of the EQ points, the weight value of that gain-value changed EQ point may be changed. In this case, the weight value of the frequency of the gain-value changed EQ point in the selected weight is edited.

Figure 8:
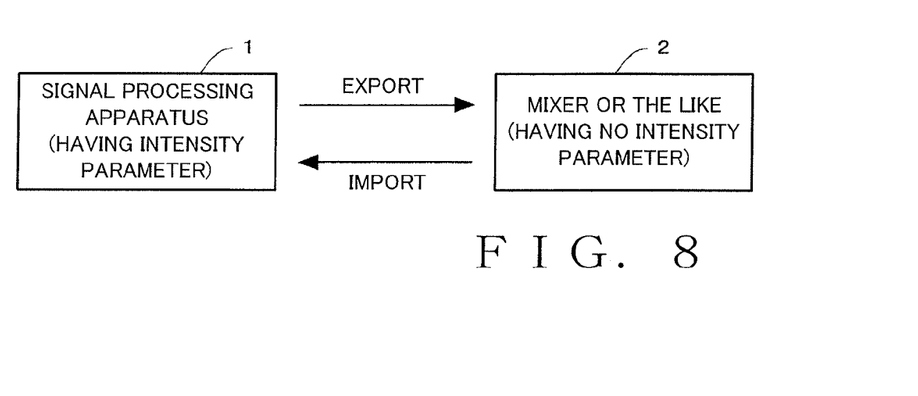
FIG. 8 is a diagram explanatory of export and import of equalizer module data f in the signal processing apparatus of the present invention.

When the data of the EQ module are to be exported from the signal processing apparatus 1 of the present invention to other equipment 2, such as a mixer, having no intensity parameter, as shown in FIG. 8, the data of the individual EQ points are exported to the other equipment 2. Let it be assumed that, in such a case, values of the data to be exported are frequencies, actual gain values and actual Q values of the individual EQ points which are values currently used in the EQ module. More specifically, in the case of the above-described first embodiment, the actual gain values and actual Q values are actual gain values of the individual EQ points each calculated by Mathematical Expression (1) above and actual Q values preset for the individual EQ points. Further, in the case of the above-described second embodiment, the actual gain values and actual Q values are actual gain values of the individual EQ points each calculated by Mathematical Expression (2) above and actual Q values preset for the individual EQ points. Furthermore, in the case of the above-described third embodiment, the actual gain values and actual Q values are actual gain values of the individual EQ points each calculated by Mathematical Expression (2) above and actual Q values of the individual EQ points modified in accordance with the actual gain values. Further, values of data to be imported as data for the EQ module from the other equipment 2 are frequencies, actual gain values and actual Q values of the individual EQ points. Let it be assumed here that the intensity parameter value for each of the EQ points is set at "1 (100%)" because the other equipment 2 has no intensity parameter.

Figure 9:
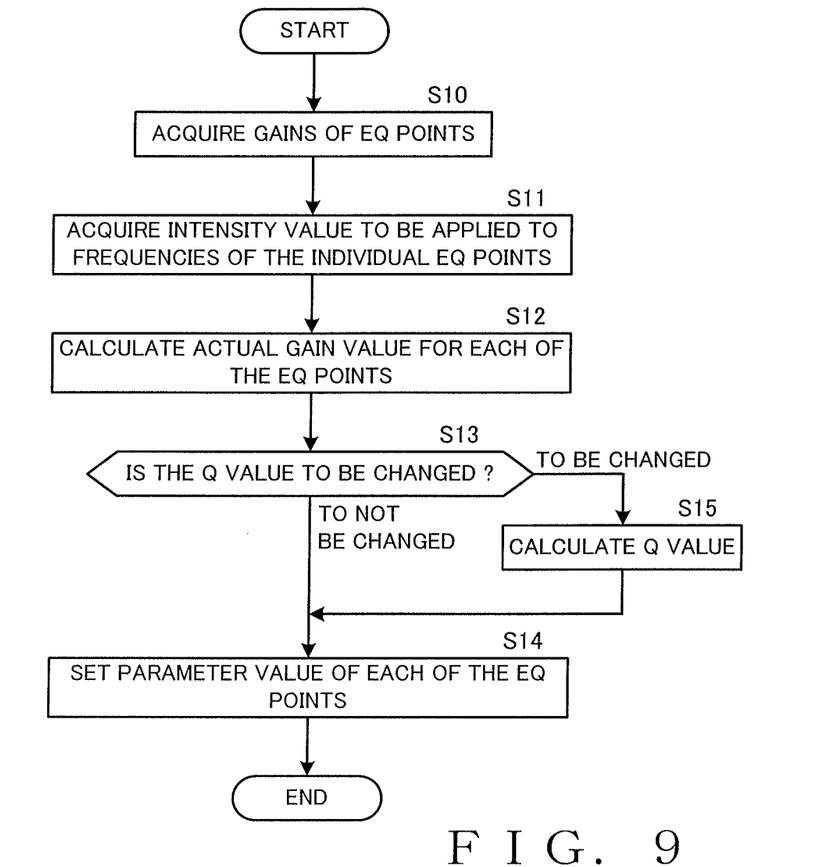
FIG. 9 is a flow chart of EQ point data change processing performed in the signal processing apparatus of the present invention.

FIG. 9 is a flow chart of EQ point data change processing performed on all of the EQ points each time the gain-setting operator 26 is operated to change the intensity parameter value.

Once it is detected that the gain-setting operator 26 has been operated on the operation section 14, the EQ point data change processing is started up, where are acquired reference gain values of the individual EQ points at step S10. Such reference gain values of the individual EQ points (EQ-point-specific reference gain values) are acquired from data preset for the corresponding EQ points and prestored in the memory 11. Then, at step S11, an intensity parameter value to be applied to the frequencies of the individual EQ points is acquired. More specifically, an intensity parameter value adjusted through an operation of the operator 27 is acquired, for each of the EQ points, as an intensity parameter value to be applied to the frequency for the EQ point in the case of the above-described first embodiment, and not only such an intensity parameter value adjusted through the operation of the operator 27 but also a weight value of the frequency is acquired for each of the EQ points in the weight curve selected from among a plurality of weight curves in the case of the above-described second and third embodiments.

Then, at step S12, an actual gain value is calculated for each of the EQ points. More specifically, in the case of the above-described first embodiment, arithmetic operations of Mathematical Expression (1) above where the reference gain value of each of the EQ points acquired at step S10 is multiplied by the intensity parameter value of the frequency for the EQ point acquired at step S11 are performed, at this step S12, to calculate an actual gain value. In the case of the above-described second and third embodiments, arithmetic operations of Mathematical Expression (2) above where the reference gain value of each of the EQ points acquired at step S11 is multiplied by the intensity parameter value and weight value at the object frequency of the EQ point acquired at step S11 are performed, at this step S12, to calculate an actual gain value. Then, a determination is made, at next step S13, as to whether the Q value too is to be changed or not. In the case of the above-described first and second embodiments, it is determined at step S13 that the Q value is not to be changed, so that the EQ point data change processing moves on to step S14. In the case of the above-described third embodiment, it is determined at step S13 that the Q value is to be changed, so that the EQ point data change processing branches to step S15. At step S15, a Q value modified in accordance with the actual gain value calculated at step S12 is calculated for each of the EQ points. More specifically, at step S15, the Q value modification is performed such that the mountain of the peak of the EQ point in question becomes thinner as the actual gain value increases. Upon completion of the operation of step S15, the processing goes to step S14, where the changed parameter value of each of the EQ points is set into the EQ module but also the data of each of the EQ points stored in the memory 11 too is updated at step S14. In the case of the first and second embodiments, the parameter value thus set is the actual gain value calculated at step S12, while, in the case of the third embodiment, the parameter value thus set is the actual gain value calculated at step S12 and the Q value calculated at step S15. Upon completion of the operation of step S14, the EQ point data change processing is brought to an end.

The above-described signal processing apparatus 1 of the present invention is constructed to display the GUI 20 of FIG. 3 on the display section 13 so as to permit setting and manipulation of parameters of the EQ module. In addition to the above, the selection buttons 21 to 23 and the operators 24 to 27 may be provided as hardware elements on the panel of the signal processing apparatus 1 so that the parameters of the EQ module can be set and operated by use of these hardware elements. In such a case, the operators 24 to 27 may be in the form of endless operators like incremental-type rotary encoders.

With the signal processing apparatus and the equalizer module of the present invention, where it is possible to sequentially change an EQ curve by manipulating the value of the intensity parameter as set forth above, the user can manipulate a particular band in an EQ curve unlike in the conventionally-known technique where morphing is performed between a plurality of predetermined patterns of EQ curves, it is possible to eliminate a need for possessing patterns of a plurality of EQ curves as required in the conventional morphing, and thus consumption of a scene memory can be reduced as compared to the conventional morphing.

The EQ module of the present invention is implemented by software using the DSP etc. and applicable to electronic equipment in general having an audio EQ module. It should also be appreciated that the EQ module of the present invention may be implemented by hardware.

Whereas various embodiments of the present invention have been described above in relation to the case where a value of the intensity parameter is set by a user manually operating an operator, the present invention is not so limited. For example, an intensity parameter value may be included as a parameter value in automatically-set data like a scene recall, or an intensity parameter value may be adjusted as appropriate in response to a control command received from outside.

Further, in a case where a plurality of channels are provided in the signal processing apparatus of the present invention, it is preferable to change the degree of the effectiveness of the intensity parameter value in accordance with the frequency band separately for each of tone generator types assigned to the individual channels. In such a case, in order to change the degree of the effectiveness of the intensity parameter value, it suffices to select, from among a plurality of weight curves, a suitable weight curve for each of the tone generator types assigned to the individual channels.

Furthermore, when an EQ curve of the EQ module is to be adjusted in the signal processing apparatus and the EQ module of the present invention, the user in many cases repetitively operates a given operator until a desired sound is obtained while listening to an audio signal, output to the speaker etc. via the audio I/F 16, each time he or she operates the operator.

Whereas the operators 24 to 27 each have been described as being in the form of a relative-value type operator, such as a rotary operator like an incremental type rotary encoder, of which a relative value (variation amount) of an operating position is detected, they may be endless operators of any other desired type. In another alternative, the operators 24 to 27 may be absolute-value type operators, such as fader operators, lever operators, joysticks, rotary type variable resistors or ribbon controllers.

Further, whereas the signal processing apparatus and equalizer module of the present invention have been described above in relation to the scheme for adjusting/changing the degree of effectiveness of the EQ by multiplying a gain value of each EQ point by an intensity value that is a magnification factor, the present invention is not so limited. For example, an intensity parameter value may be added to a gain value of each EQ point. In such a case, because an output gain can be adjusted without an overall shape of an EQ curve being changed, the signal processing can be manipulated by a single module. Alternatively, an intensity parameter value may be added or multiplied to a frequency value (on the horizontal axis of FIG. 2 etc.) of each EQ point. For example, in a case where it is desired that an EQ curve set with frequency bands suited for a particular musical instrument be applied to another type of musical instrument, it is possible to set an EQ with frequency bands suited for the other type of musical instrument by stretching/compressing the EQ curve in the frequency axis direction; in this way, an EQ can be set with frequency bands suited for various types of musical instruments. Furthermore, the above-described embodiments may be used in any desired combination. Moreover, the number of frequency bands constituting the one EQ module may be designed as desired without being limited to just three.

This application is based on, and claims priority to, JP PA 2014-053083 filed on 17 Mar. 2014. The disclosure of the priority application, in its entirety, including the drawings, claims, and the specification thereof, are incorporated herein by reference.

What is claimed is:

1. A signal processing apparatus comprising:
a storage device; and
a processor configured to execute computer executable instructions recorded on the storage device, the computer executable instructions including instructions, that when executed by the processor, cause the signal processing apparatus to:
receive a single magnification input for adjusting an intensity of a reference equalizer curve, the single magnification input to be multiplied with each of gain values of frequencies corresponding to a plurality of control points in the reference equalizer curve;
determine a given equalizer curve by collectively adjusting the intensity of the plurality of control points in the reference equalizer curve by multiplying the received single magnification input with each of the gain values of the frequencies corresponding to the plurality of control points in the reference equalizer curve; and
perform signal processing on an audio signal according to a frequency characteristic indicated by the given equalizer curve, wherein a gain characteristic, on a frequency axis, of the audio signal is adjusted based on the given equalizer curve.

2. The signal processing apparatus according to claim 1, wherein the computer executable instructions further include instructions, that when executed by the processor, cause the signal processing apparatus to determine a gain characteristic of a frequency domain other than the control point in the given equalizer curve in accordance with a change in the gain value of the control point.

3. The signal processing apparatus according to claim 1, wherein the computer executable instructions further include instructions, that when executed by the processor, cause the signal processing apparatus to change a Q value of a particular control point in the given equalizer curve in accordance with adjustment by the single magnification input.

4. The signal processing apparatus according to claim 3, wherein the Q value is changed to become higher as the single magnification input is changed to become greater.

5. The signal processing apparatus according to claim 1, wherein the computer executable instructions further include instructions, that when executed by the processor, cause the signal processing apparatus to not change a Q value of a particular control point in the given equalizer curve in accordance with adjustment by the single magnification input.

6. The signal processing apparatus according to claim 1, wherein the signal processing apparatus is caused to perform the signal processing on the audio signal according to the given equalizer curve using weight information indicative of a degree of effectiveness of the single magnification input that is defined per frequency.

7. The signal processing apparatus according to claim 6, wherein the weight information includes a plurality of weight curves, and one of the weight curves is selected and used in the signal processing on the audio signal.

8. The signal processing apparatus according to claim 1, wherein the computer executable instructions further include instructions, that when executed by the processor, cause the signal processing apparatus to, when data for use in an equalizer is to be exported to other equipment, export frequencies, gain values, and Q values of the plurality of control points currently set in the given equalizer curve.

9. The signal processing apparatus according to claim 1, wherein the computer executable instructions further include instructions, that when executed by the processor, cause the signal processing apparatus to, when data for use in an equalizer is to be imported from other equipment, import data indicative of an equalizer curve currently set in said other equipment, set the data indicative of the imported equalizer curve as the reference equalizer curve, and set the single magnification input at "1".

10. The signal processing apparatus according to claim 1, wherein the computer executable instructions further include instructions, that when executed by the processor, cause the signal processing apparatus to receive the single magnification input in response to a user's input operation.

11. A method for processing an audio signal using a signal processing apparatus, said method comprising:
receiving a single magnification input for adjusting an intensity of a reference equalizer curve, the single magnification input to be multiplied with each of gain values of frequencies corresponding to a plurality of control points in the reference equalizer curve;
determining a given equalizer curve by collectively adjusting the intensity of the plurality of control points in the reference equalizer curve by multiplying the received single magnification input with each of the gain values of the frequencies corresponding to the plurality of control points in the reference equalizer curve; and
performing signal processing on the audio signal according to a frequency characteristic indicated by the given equalizer curve, wherein a gain characteristic, on a frequency axis, of the audio signal is adjusted based on the given equalizer curve.

12. A non-transitory, computer-readable storage medium storing a program executable by a processor to perform a method for processing an audio signal using a signal processing apparatus, said method comprising:
receiving a single magnification input for adjusting an intensity of a reference equalizer curve, the single magnification input to be multiplied with each of gain values of frequencies corresponding to a plurality of control points in the reference equalizer curve;
determining a given equalizer curve by collectively adjusting the intensity of the plurality of control points in the reference equalizer curve by multiplying the received single magnification input with each of the gain values of the frequencies corresponding to the plurality of control points in the reference equalizer curve; and
performing signal processing on the audio signal according to a frequency characteristic indicated by the given equalizer curve, wherein a gain characteristic, on a frequency axis, of the audio signal is adjusted based on the given equalizer curve.

13. An equalizer processing apparatus having set therein an equalizer curve for use in signal processing, the equalizer processing apparatus comprising:
a storage device; and
a processor configured to execute computer executable instructions recorded on the storage device, the computer executable instructions including instructions, that when executed by the processor, cause the equalizer processing apparatus to:
generate a new equalizer curve for use in signal processing on an audio signal according to a frequency characteristic indicated by the new equalizer curve, wherein a gain characteristic, on a frequency axis, of the audio signal is adjustable based on the new equalizer curve, the new equalizer curve being generated by multiplying each of values of a plurality of control points in the equalizer curve set in said equalizer processing apparatus by a single, adjustable magnification input.

* * * * *